United States Patent
Sung et al.

(10) Patent No.: US 7,103,862 B2
(45) Date of Patent: Sep. 5, 2006

(54) METHOD TO DESIGN AND VERIFY AN INTEGRATED CIRCUIT DEVICE WITH MULTIPLE POWER DOMAINS

(75) Inventors: Nai-Yin Sung, Hsin Chu (TW); Hsing-Chien Huang, Hsin Chu (TW); Jan-Hun Tsai, HsinChu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 337 days.

(21) Appl. No.: 10/807,037

(22) Filed: Mar. 23, 2004

(65) Prior Publication Data

US 2005/0216872 A1    Sep. 29, 2005

(51) Int. Cl.
*G06F 17/50*  (2006.01)
(52) U.S. Cl. .......................................... 716/5
(58) Field of Classification Search ............... 716/5
See application file for complete search history.

(56) References Cited

U.S. PATENT DOCUMENTS

| | | | |
|---|---|---|---|
| 5,084,824 A | 1/1992 | Lam et al. ................... 364/490 |
| 5,666,288 A | 9/1997 | Jones et al. .................. 364/490 |
| 5,812,416 A | 9/1998 | Gupte et al. ................. 364/490 |
| 5,903,475 A | 5/1999 | Gupte et al. ................. 364/578 |
| 6,043,128 A | 3/2000 | Kamiya ....................... 438/289 |
| 6,083,271 A * | 7/2000 | Morgan ........................... 716/1 |
| 7,000,214 B1 * | 2/2006 | Iadanza et al. ................ 716/18 |

* cited by examiner

*Primary Examiner*—Jack Chiang
*Assistant Examiner*—Brandon W. Bowers

(57) ABSTRACT

A new method to design and verify a multi-power integrated circuit device is achieved. A multi-power gate-level netlist is provided. This multi-power gate-level netlist includes multi-power net information. This multi-power gate-level netlist is translated to thereby create a non-multi-power gate-level netlist. This translating comprises removing the multi-power net information. Circuit cells are then placed and routed to create a physical view of the multi-power integrated circuit device. This placing and routing step uses the non-multi-power gate-level netlist. Text labels for the multi-power net information are attached to the physical view. The physical view and the multi-power gate-level netlist are compared to verify the correctness of the physical view and to complete the design and verification of the multi-power integrated circuit device.

20 Claims, 7 Drawing Sheets

METHOD TO DESIGN AND VERIFY AN INTEGRATED CIRCUIT DEVICE WITH MULTIPLE POWER DOMAINS

BACKGROUND OF THE INVENTION (1) Field of the Invention

The invention relates to designing and verifying an integrated circuit device with multiple power domains, and more particularly, to a method and an apparatus for automatically placing and routing and then verifying a multi-power IC device.

(2) Description of the Prior Art

As deep sub-micron ASIC and IC technology evolves, integrated circuit devices are being designed and fabricated with digital blocks, analog blocks, and embedded memories on single chips. Such combinational IC devices are commonly called multi-power devices. In multi-power devices, it is well known that the digital circuits typically occupy the majority of the die area (typically more than 70%). These digital circuits have fast switching speeds and therefore generate a great deal of switching noise on the digital power supply. This noisy digital power is generally not acceptable for use in the analog circuits co-resident on the chip. Therefore, a separate analog power must be provided.

Referring now to FIG. 1, a typical mixed-mode integrated circuit device 10 is illustrated. In this device 10, a digital block 14 and an analog block 18 are co-resident. The digital circuit 14 comprises typical combinational logic gates and registers. The digital circuit physical view or layout may be generated using automatic place and route software that automatically selects standard digital layout cells from a library, places these cell into the layout, and then routes conductive lines to each standard cell. The digital block 14 has a set of input and output (I/O) pins 22 to provide connectivity outside the IC device 10.

The analog block 18 comprises the analog circuitry designed onto the IC device 10. For example, analog-to-digital converters or operational amplifiers may be integrated in the analog block 18. While the analog block may be automatically placed and routed, often, these circuits must be individually drawn using a computer-aided design (CAD) system to insure that performance specifications are achieved. However, the automated place and route software may still place and route the completed analog block 18 into the IC device layout 10. The analog block 18 has a set of I/O pins 26 that provide external connectivity.

The particular requirements of the example IC device 10 dictate the use of several power supplies. For example, the digital circuit 14 is powered by the VDD1 38 line and return ground VSS 30. As discussed above, the high speed switching capabilities of the digital circuit 14 tends to make the digital circuit power supply, VDD1 38, very noisy. That is, switching noise is coupled onto the dc voltage level of the power supply. Therefore, the analog circuit 18 is powered using a separate analog power supply VCC 34. Additionally, the digital power supply VDD1 38 and the analog power supply VCC 34 may comprise different voltage values.

In addition to the need to split the analog and digital supplies, there is an additional need for creating multiple power supplies or multi-power domains. The output pin 62 for the digital block 14 contains a pre-driver or low voltage (LV) portion 54 and a post-driver or high voltage (HV) portion 58. For example, the low voltage 54 portion and high voltage portion 58 may comprise a level-shifter circuit that is needed for shifting the internal voltage level of the digital circuit 14 up to a higher voltage used in the external system.

In this case, the low voltage portion 54 of the output pin is powered by the VDD2 supply 42 while the high voltage portion 58 is powered by the VDD3 supply 46. For example, the VDD2 supply 42 may comprise a voltage of about 2.5 Volts and the VDD3 supply 46 may comprise a voltage of about 3.3 Volts.

These power supply signals 34, 38, 42, and 46 may be routed in a power cut cell 50. This power cut cell 50 is connected to the main power supply in normal operation. The power cut cell 50 comprises a number of diodes, not shown, between the two power rails to thereby provide separation between the various power domains on the IC device while also providing electrostatic discharge (ESD) protection paths. Further, more than one power cut cell 50 may be used on the IC device, as needs dictate. As will be seen, the use of these power cut cells 50 causes special problems when automated placement and routing software are used to design and layout these multi-power IC devices.

Referring now to FIG. 2, a flow chart of key steps in an integrated circuit design and verification method is illustrated. In a typical IC design, a gate-level netlist is generated as shown in step 100. This gate-level netlist is typically generated by a logic synthesis tool. Frequently, the design of the analog and digital blocks of the multi-power device are performed by separate engineers or engineering teams. The circuits are simulated on the CAE workstation tool to verify their performance against the design specification or perhaps against a high-level model.

A typical scenario for the design process involves significant segmentation of the design task. For example, it is a frequent occurrence in the art for one company, in this case referred to as the customer, to design an integrated circuit device and perform verification simulations at the gate-level. Once the first company is satisfied with the correctness of the circuit design, the design netlist is handed off to a second company where the design is converted to a physical view or layout sufficient for the creation of photolithographic reticles. These reticles, or masks, are then used, perhaps by yet a third company, to fabricate the integrated circuit devices in a wafer fabrication facility.

It is important to note that, at this point in the process, the gate-level netlist file 100 typically does not contain multi-power nets. This is because the typical gate-level simulation tools, such as are used for simulating the digital block, are capable of only binary simulations. Pre-simulation and post-simulation analysis is carried out by the customer on the gate-level netlist without the multi-power information or nets in step 104. Further, static timing analysis (STA) is completed using the gate-level netlist without multi-power nets in step 108. The customer evaluates the results of the simulations and analysis of steps 104 and 108 to verify the correctness of the design in step 112. If further refinements are warranted, the schematic and netlist are updated in step 118 to generate a new netlist for further simulation and analysis. Once the design is deemed correct in step 112, the customer is able to release the gate-level netlist 100 in step 116. Once again, this netlist does not contain the multi-power net information that would be needed to fully verify a completed physical layer.

Referring now to FIG. 3, the customer gate-level netlist 120 without multi-power nets is brought into the company where the physical view or layout steps will be performed. This gate-level netlist 120 is imported into a placement and routing software system in step 124. The placement and routing software will parse the gate-level netlist and select all of the standard logic cell components needed for the design. These standard logic cells will then be placed in an array in the area of the IC layout designated for the logic section. Finally, a conductive line layer will be automatically routed to connect each standard cell in the array to the appropriate inputs and outputs.

Note that several special techniques must be used in this placement and routing sequence to compensate for the use of multiple power domains on the design. First, the netlist must be manually edited to attach a ":" to each of the power net references the first placement and routing step 124. This will cause all of the power nets to be recognized as 'virtually shorted' by the placement and routing software. Once the first placement and routing pass is completed in step 124, a physical view or layout is generated in GDS format as output 128.

At this point, a first layout versus schematic verification (LVS) is performed in step 132. Note that this LVS step 132 is performed using the original customer gate-level netlist 120 without multi-power nets. After the physical view output 128 is verified by the LVS step 132, a second placement and routing operation is performed in step 134. In the second placement and routing operation 134, the text labeling is added to the top view layout. Particular conductive lines and nodes are thereby labeled as belonging to particular power domains in the multi-power scheme and the power domains are separated. The second placement and routing operation of step 134 generates the second physical view output 138.

The second physical view output 138 is now ready for LVS. However, the customer gate-level netlist 120 must now be revised to add all of the multi-power net information in step 142. The revised netlist is thereby generated 144. Finally, the second physical view 138 is verified by a LVS check against the revised netlist 144 to complete an LVS verification with multi-power nets in step 146.

Notice that the original customer gate-level netlist 120 has been altered in two ways. First, in step 124, the original netlist 120 was manually altered to add the ":" to allow the placement and routing software to work. Second, the original netlist 120 was altered to add the multi-power nets into the netlist in step 142. Each step of alteration is risky for the second company to undertake. Any deviation in the original netlist 120 received from the customer could cause an error to be introduced that the customer is unaware of. Further, the customer has no opportunity to simulate or analyze the altered netlist to thereby detect errors using the customer's design tools. Finally, the process sequence forces the company performing the IC device layout to perform two, separate passes of placement and routing and LVS verification. This extra processing ties up very expensive human and computing resources.

Several prior art inventions describe multi-power devices and integrated circuit design methods and tools. U.S. Pat. No. 6,043,128 to Kamiya teaches a method to form a semiconductor device capable of handling multiple power sources. Specifically, the method teaches the fabrication of MOS transistors with differing gate oxide thicknesses. U.S. Pat. No. 5,084,824 to Lam et al discloses a method and an apparatus for generating a gate-level netlist for an integrated circuit macrocell. The gate-level netlist is suitable for use in a simulation model and is derived from the physical layout of the macrocell. U.S. Pat. No. 5,666,288 to Jones et al teaches a method and an apparatus for designing an integrated circuit. A behavioral model and an initial logic cell library are provided to a design synthesis tool. This design synthesis tool processes these inputs to create a gate-level schematic netlist. Further processing redefines cell boundaries, transistor sizes, power rails, and cell pitches and heights to thereby optimize the design. A new hybrid cell library is then created based on these optimizations. This new hybrid cell library is then used for automatic placement and routing. U.S. Pat. No. 5,812,416 to Gupte et al teaches a method and an apparatus for automatically generating synthesis scripts and hierarchical flow connectivity diagrams for use in an integrated circuit design. U.S. Pat. No. 5,903,475 to Gupte et al discloses a method and an apparatus to verify an ASIC design using a test bench module.

SUMMARY OF THE INVENTION

A principal object of the present invention is to provide an effective method and an apparatus to design and verify a multi-power integrated circuit device.

A further object of the present invention is to provide a method to improve placement and routing and layout versus schematic (LVS) verification of a multi-power integrated circuit device.

Another further object of the present invention is to enable a single placement and routing and LVS pass to complete the layout of a multi-power IC device.

Another yet further object of the present invention is to automatically translate the gate-level netlist used for placement and routing and for LVS to thereby eliminate errors.

Another yet further object of the present invention is to automatically insert multi-power net information into a gate-level netlist to thereby facilitate use of clock tree synthesis (CTS) placement and routing of a multi-power integrated circuit device.

In accordance with the objects of this invention, a new method to design and verify a multi-power integrated circuit device is achieved. A multi-power gate-level netlist is provided. This multi-power gate-level netlist includes multi-power net information. This multi-power gate-level netlist is translated to thereby create a non-multi-power gate-level netlist. This translating comprises removing the multi-power net information. Circuit cells are then placed and routed to create a physical view of the multi-power integrated circuit device. This placing and routing step uses the non-multi-power gate-level netlist. Text labels for the multi-power net information are attached to the physical view. The physical view and the multi-power gate-level netlist are compared to verify the correctness of the physical view and to complete the design and verification of the multi-power integrated circuit device.

Also in accordance with the objects of this invention, a new apparatus to design and verify a multi-power integrated circuit device is achieved. The apparatus first comprises a means of storing a multi-power gate-level netlist that is provided. A means of translating the multi-power gate-level netlist to thereby create a non-multi-power gate-level netlist is provided. The means of translating comprises removal of the multi-power net information. A means of placing and routing circuit cells to create a physical view of the multi-power integrated circuit device is provided. The means of placing and routing uses the non-multi-power gate-level netlist. Text labels for the multi-power net information are attached to the physical view. Finally, a means of comparing the physical view and the multi-power gate-level netlist is provided. The correctness of the physical view is thereby verified.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose the method and the apparatus of design and verification of a multi-power integrated circuit device of the present invention. It should be clear to those experienced in the art that the present invention can be applied and extended without deviating from the scope of the present invention.

Figure 1:
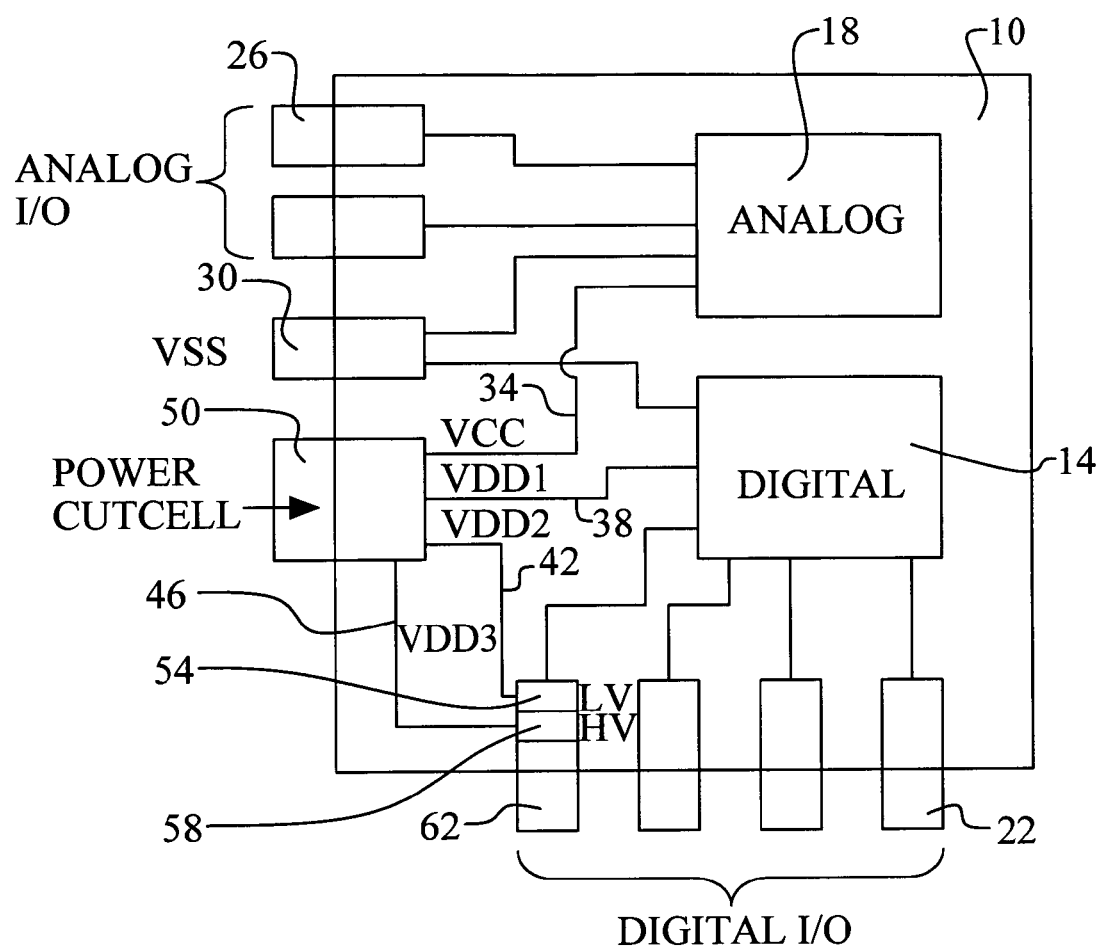
FIG. 1 illustrates a block-level layout organizational layout a multi-power integrated circuit device.

As in the example integrated circuit of FIG. 1, the method of the present invention is applied to the design and verification of a multi-power IC device. Particularly, this IC device contains at least two power domains.

Figure 2:
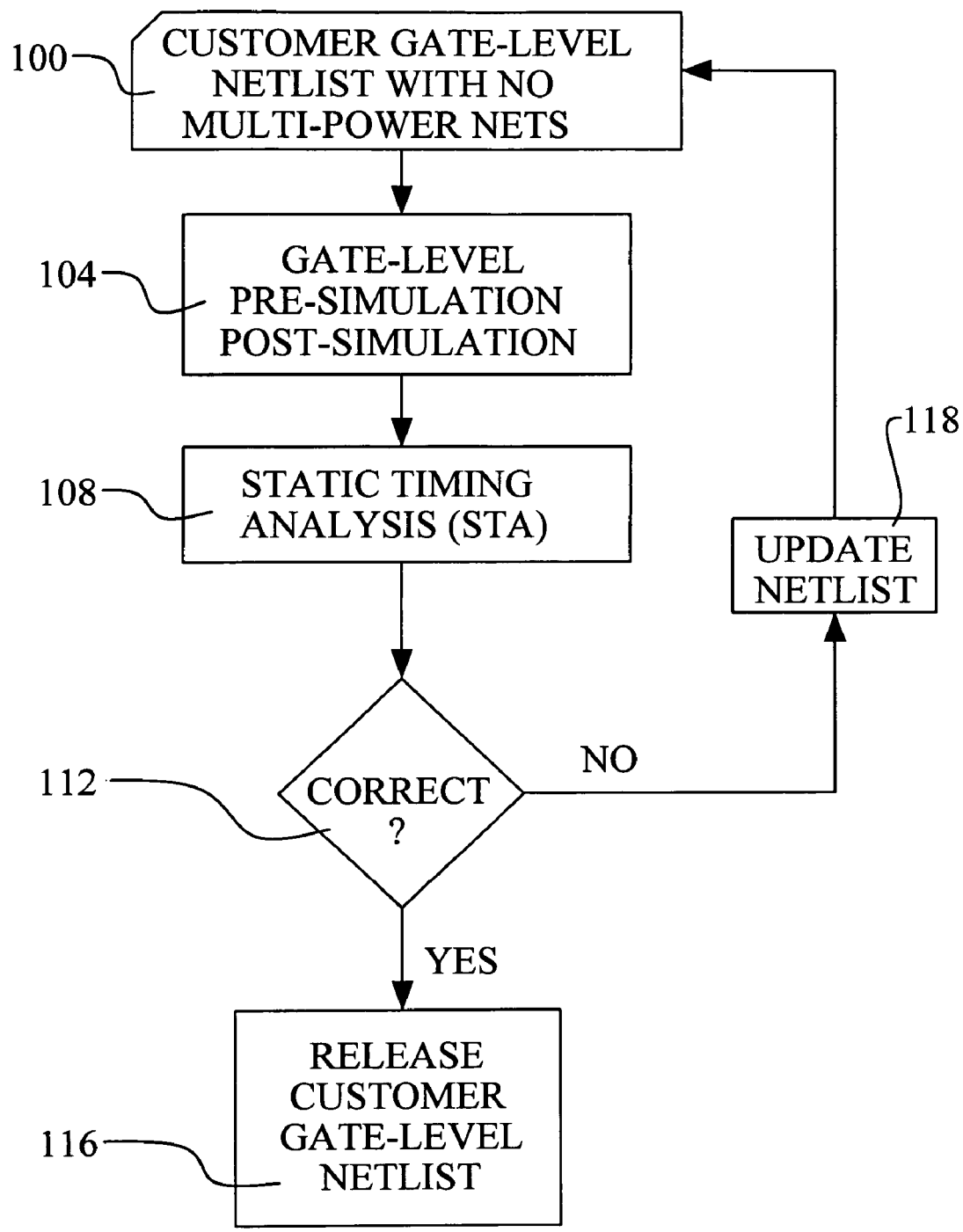
FIGS. 2 and 3 illustrate a traditional hardware circuit design, layout, and verification flow.
Figure 4:
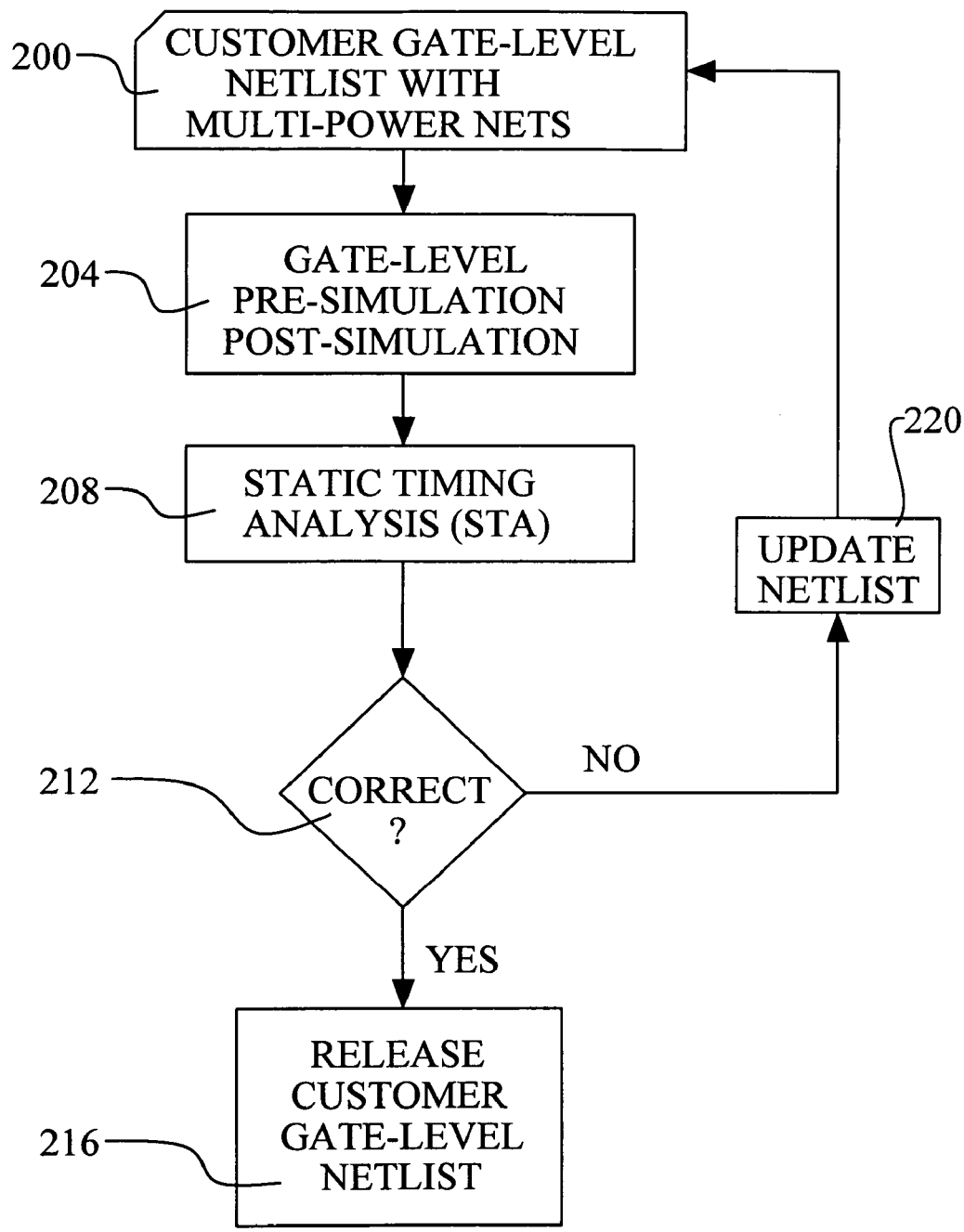
FIGS. 4 and 5 illustrate the first preferred embodiment flow of the circuit design, layout, and verification of the present invention.

Referring now to FIG. 4, the first preferred flow of design, layout, and verification for a multi-power IC device is shown. The method begins with the customer-generated netlist 200. As in the example case of FIG. 2, this netlist 200 is generated by the customer's schematic capture system, typically in a CAE workstation. However, an important feature of the present invention is the inclusion of the multi-power nets, representing the multiple power domains of the design, in the gate-level netlist 200. As in the example case, the customer simulates this gate-level netlist in step 204. Further, static timing analysis (STA) may be performed in step 208. The results of the simulation and analysis steps are compared to the required performance specifications and/or behavioral models in step 212. If the gate-level netlist 200 performs correctly, then the customer gate-level netlist 200 is released for circuit layout and verification in step 216. If problems are found in the simulation and analysis steps, then the netlist is updated as needed in step 220.

The key difference in the method of the present invention up to this point is the inclusion of the multi-power nets in the customer gate-level netlist 200. By including this information at this stage in the process, two benefits are derived. First, the customer can simulate the multi-power scheme with simulation tools prior to release of the netlist 200. Second, the netlist 200 that is released to the layout company in step 216 has been verified internally by the customer. Third, this netlist 200 can be used by the layout and verification process without manual changes. Therefore, the likely of creating errors is greatly reduced.

Figure 5:
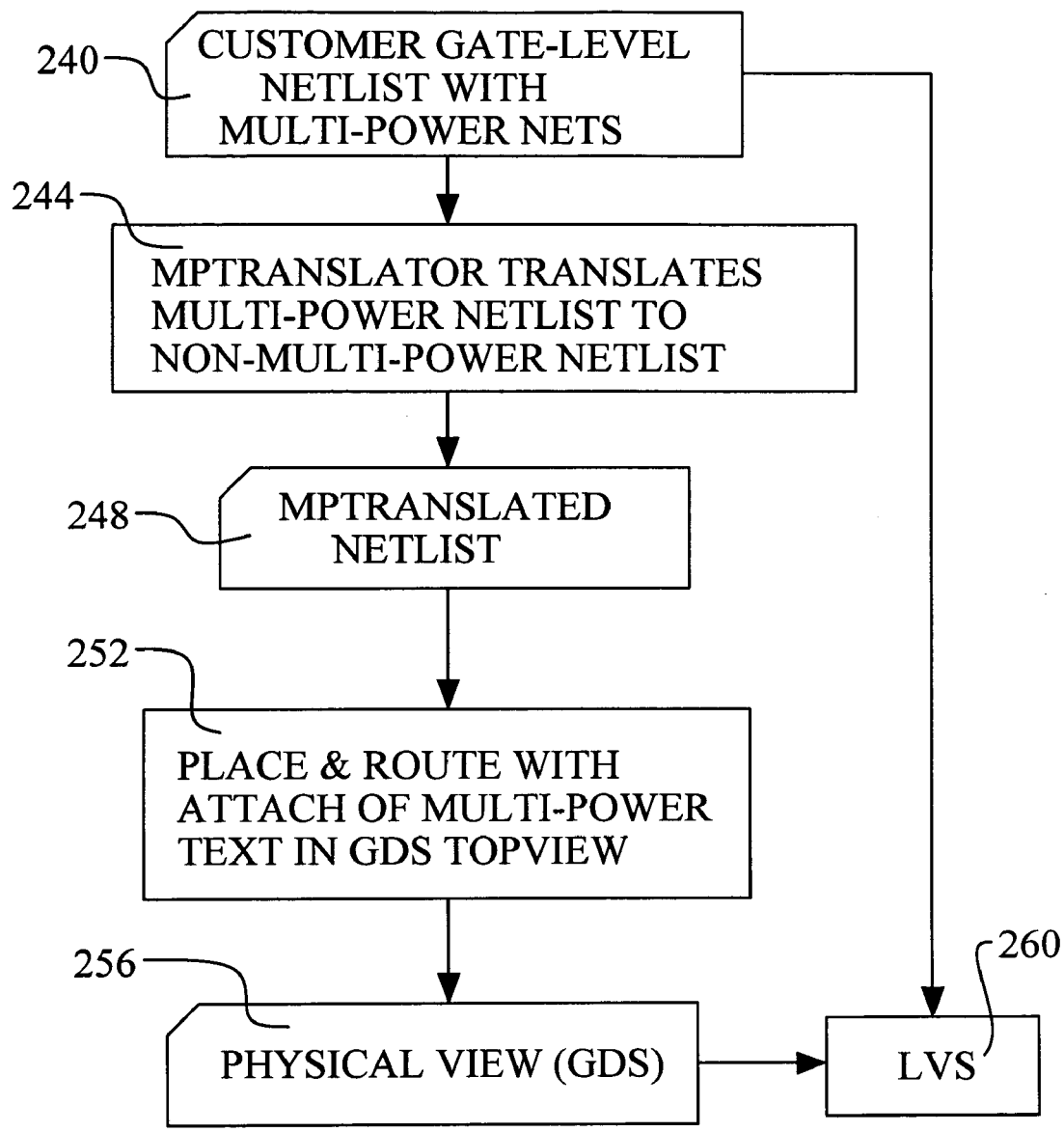

Referring now to FIG. 5, the layout and verification phase of the first preferred embodiment of the present invention is illustrated. The customer gate-level netlist 240, including the multi-power net information, is imported into the design environment. For example, the netlist 240, comprises a data file that is delivered to the design environment and stored. In an important step in the method, the netlist 240 is translated in step 244. This translation process converts the gate-level netlist with multi-power nets 240 into a gate-level netlist that is non-multi-powered. This translation step is performed using a software program called MPTRANSLATOR that has been developed as a key feature of the present invention.

The MPTRANSLATOR is a software program that translates a multi-power netlist into a non-multi-power netlist. This translated netlist can then be used with traditional automated tools such as Place-and-Route software and logic verification to schematic (LVS) software.

Prior to conversion, the multi-power netlist records have the form:

PVIDD UUAVDD(.TVDDIP(A), .TVDD(B)

and reflect a Verilog netilst that connects the power pin. However, after the translation, the non-multi-power netlist is converted to the form:

PVIDD UUAVDD( )

and does not contain multi-power information. No information about the multiple power supplies remains in the translated netlist.

The placement and routing (P&R) phantom cells contain text in the top view. Therefore, it is not necessary to attached additional text to the top view pertaining to the multi-power cells. Because the I/O pads abut together, the physical property allows for completion of the LVS process without the presence of the multi-power information in the translated netlist.

The MPTRANSLATOR automatically creates a new version of the netlist, called an MPTranlated netlist 248. This translated netlist 248 is compatible with the placement and routing software used in step 252. Yet, the automatic nature and robustness of the MPTRANSLATOR allows the original netlist 240 to be altered without introducing errors.

The placement and routing software uses the non-multi-power gate-level netlist 248 to create the physical layout 256 of the IC device in step 252. The placement and routing software, such as that commercially available from Avanti Corporation or from Cadence Corporation, first parses the non-multi-power gate-level netlist 248 to extract instances of standard cell library gates. These standard cells are then physically placed into the physical layout array. The non-multi-power gate-level netlist 248 is again parsed to extract the connectivity of the gates. The standard cell array is then connected per the netlist information. The power supply and ground return paths are then placed into the physical view layout 256. Finally, multi-power node text is attached to the topview of the physical layout view to complete the physical view 256.

Following the placement and routing step 252, the physical view is output as a GDS format data file 256. This physical view 256 represents the cumulative reticle layers that are needed to form the semiconductor features on the IC device. The physical view 256 can now be verified against the customer gate-level netlist 240. A layout versus schematic (LVS) software, such as that commercially available from Mentor Graphics Corporation, Avanti Corporation, or Cadence Corporation, is used. The LVS software compares the customer gate-level netlist 240 with the physical view 256 to find errors in connectivity (shorts or opens), errors in device formation, and missing or extra devices. The LVS process of step 260 insures that the customers gate-level netlist 240 is accurately represented by the physical view 256.

It is important to note that this first preferred embodiment of the present invention uses the original, customer-supplied netlist 240 for the LVS process 260. This is important because, when the design passes this LVS step 260, the design is approved for manufacturing. The physical view 256 may then be used to create a set of manufacturing reticles. This is a very important milestone in the design sequence. Manufacturing reticles are very expensive to fabricate. In addition, these reticles cannot typically be reworked. If an error is found in the physical view after reticles have been fabricated, the reticles are worthless, but very expensive, scrap. This is why it is so essential that the LVS verification step 260 be performed directly against a gate-level netlist 240 that has been officially released by the customer. The advantageous features of the present invention allow the customer-released netlist 240 to be used in this way.

Figure 3:
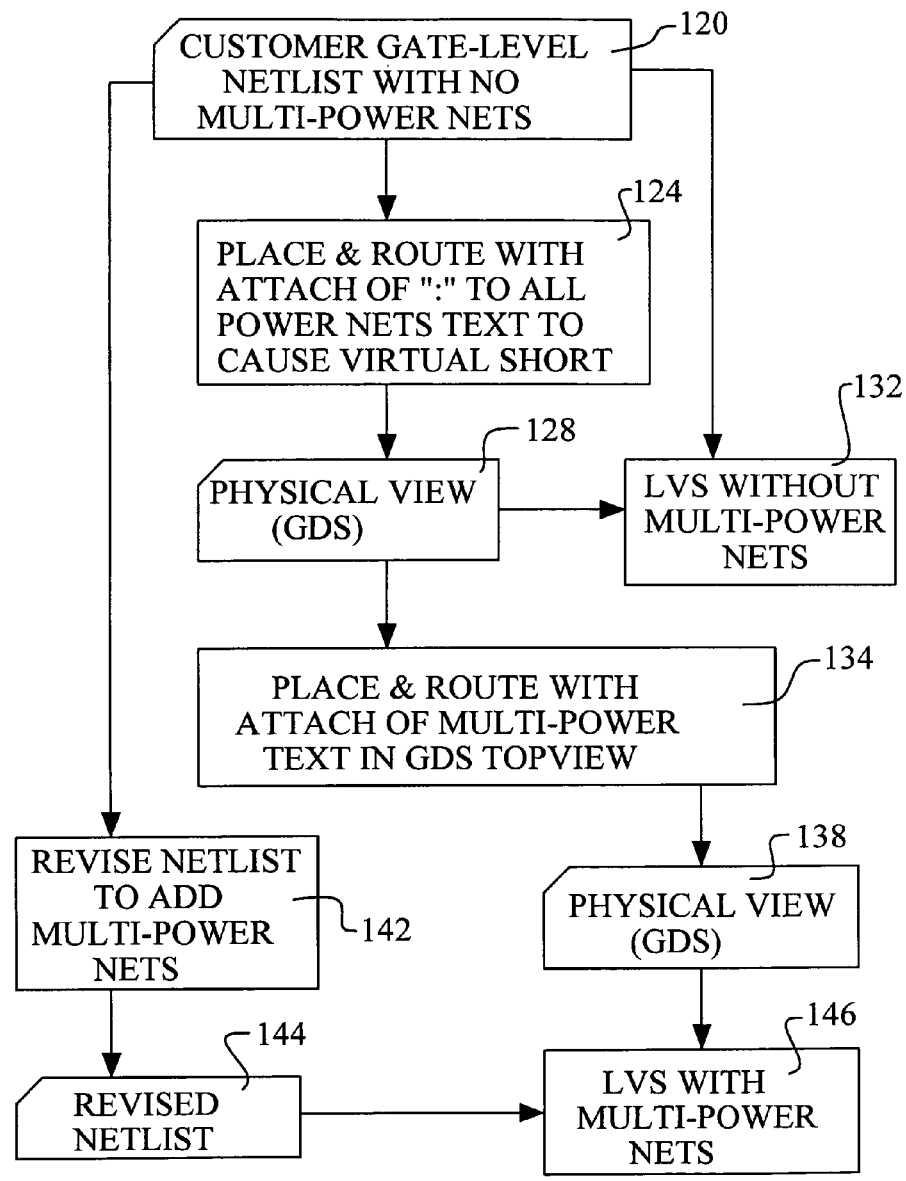

The MPTranslator function 244 allows a single customer gate-level netlist 240, containing the multi-power nets, to be automatically modified into a translated, non-multi-power netlist 248 that is suitable for the placement and routing software. This same original netlist 240 can then be used to verify the final layout in the LVS step 260. The potential errors inherent in the manual revision of the customer netlist in the example method of FIG. 3, step 142, are thereby avoided.

Figure 6:
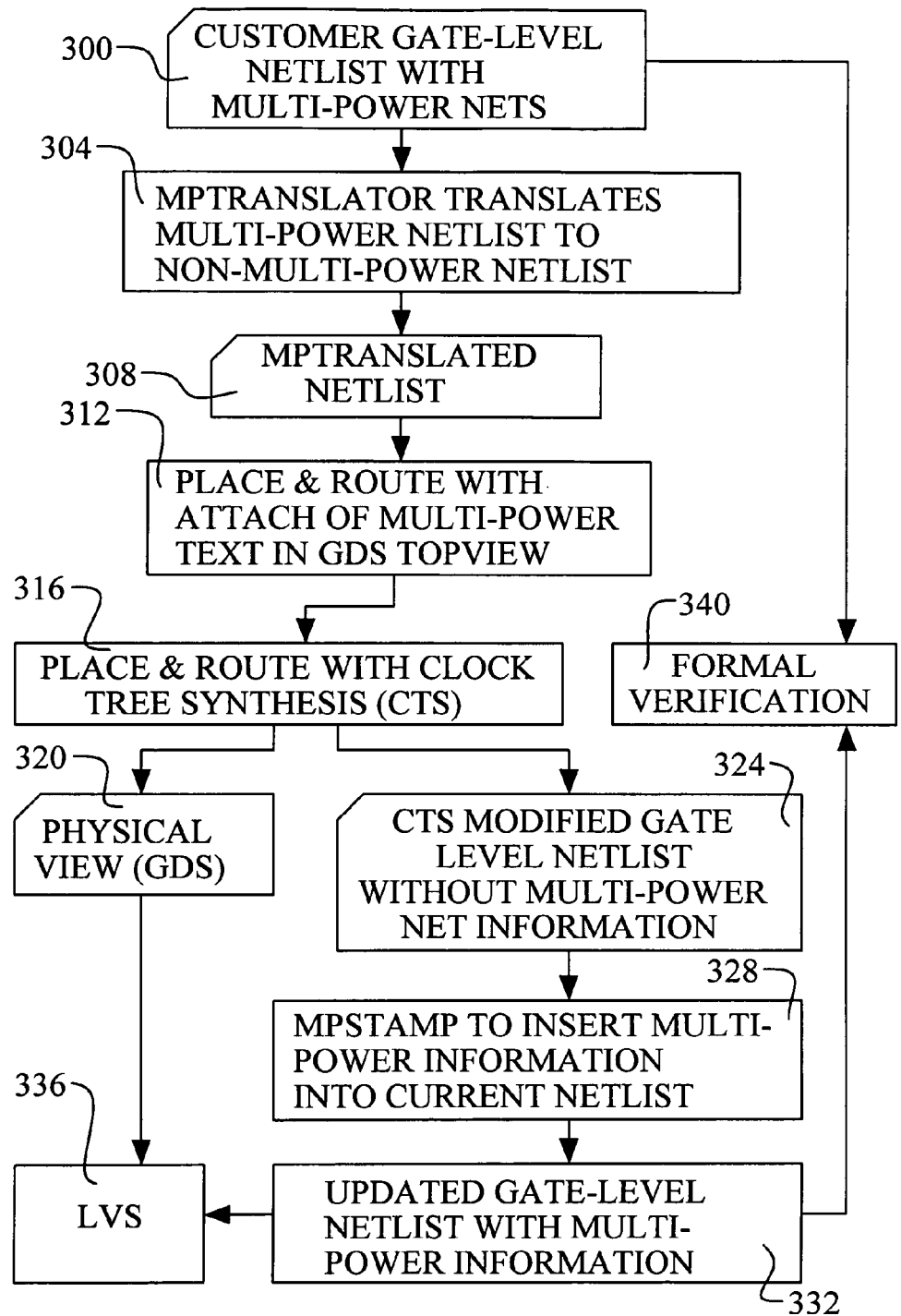
FIG. 6 illustrates the second preferred embodiment flow of the circuit design, layout, and verification of the present invention.

Referring now to FIG. 6, a second preferred embodiment of the present invention is illustrated. The second preferred embodiment discloses the special circumstance wherein a clock tree synthesis (CTS) placement and routing is performed. In a CTS placement and routing, the placement and routing software adjust the layout and routing of the circuit cells and even adds additional cells to guarantee the relative timing of critical signals in the circuit design. CTS placement and routing prevents clock skew or clock race conditions from being inadvertently introduced into the design by the placement and routing software.

The second embodiment method again begins with the customer-released netlist with multi-power nets 300. As in the first embodiment, this customer netlist 300 has been thoroughly simulated and analyzed by the customer as in FIG. 4. Referring again to FIG. 6, the customer-released netlist 300 must first be translated to change the multi-power netlist 300 into a non-multi-power netlist in step 304. The MPTranslator software of the present invention is used for this translation step. The translated netlist is outputted as 308.

The non-multi-power netlist version 308 is used by the placement and routing software to create a first pass place and route of the design in step 312 as described in the first embodiment. In addition, the multi-power node text is attached to the topview of the first pass layout.

In step 316, the first pass place and route is processed using a CTS algorithm by a commercially available software tool. The CTS placement and routing tool analyzes critical timing paths to insure that, for example, clock race and clock skew conditions have not been created by the particular arrangements of cells and connectivity routes chosen in the first pass layout. The CTS tool can change the placement and routing of cells within the physical view. More importantly, the CTS tool can alter the netlist 308 if needed. For example, additional signal buffer-drivers may be added to a signal path to reduce switching speed or account for greater than expected connectivity loading.

The CTS placement and routing step 316 creates a physical view 320 layout of the IC design in GDS format. The CTS placement and routing step 316 also creates a CTS-modified gate-level netlist 324. This netlist 324 does not have the multi-power net information that the original customer netlist 300 possesses.

Another important feature of the present invention is the insertion of the multi-power information into the CTS-modified netlist 324 in step 328. A software program called MPStamp, that is a part of the present invention, is used to extract the multi-power net information from the original, customer-released netlist 300 and insert this multi-power net information into the CTS-modified netlist 324. The MPStamp program creates an updated gate-level netlist with multi-power information 332. The MPStamp program attaches the multi-power information from the original multi-power netlist to the new P&R tools generated netlist.

The physical view 320 and the updated gate-level netlist with multi-power information 332 may now be compared to verify the design in step 336. Once again, a LVS program is used to perform the verification. It is important to note that, in this case, the customer-released netlist 300 is not directly used for the verification step 336. Rather, the customer-released netlist 300 has been automatically updated by the software programs. The MPTranslator software, the CTS placement and routing software, and the MPStamp software have each altered the original netlist 300 to create the updated netlist 332. It is important to note that the MPTranslator and MPStamp software programs automate this process to thereby avoid errors.

An additional formal verification may be performed in step 340. In this formal verification step 340, the updated gate-level netlist 332 and the original customer-release netlist 300 may be compared and verified. For example, the updated gate-level netlist 332 may be submitted to a battery of simulations provided by the customer to verify that the performance has not been altered by the CTS step 316. Once the updated gate-level netlist 332 passes the formal verification, the completed design is released to production.

It is important to note that the novel features of the present invention, as disclosed in the second embodiment, improve the design and verification process. The original customer netlist 300 is not manually altered as in the example process step 142 in FIG. 3. A single LVS step may be performed to verify the design.

Figure 7:
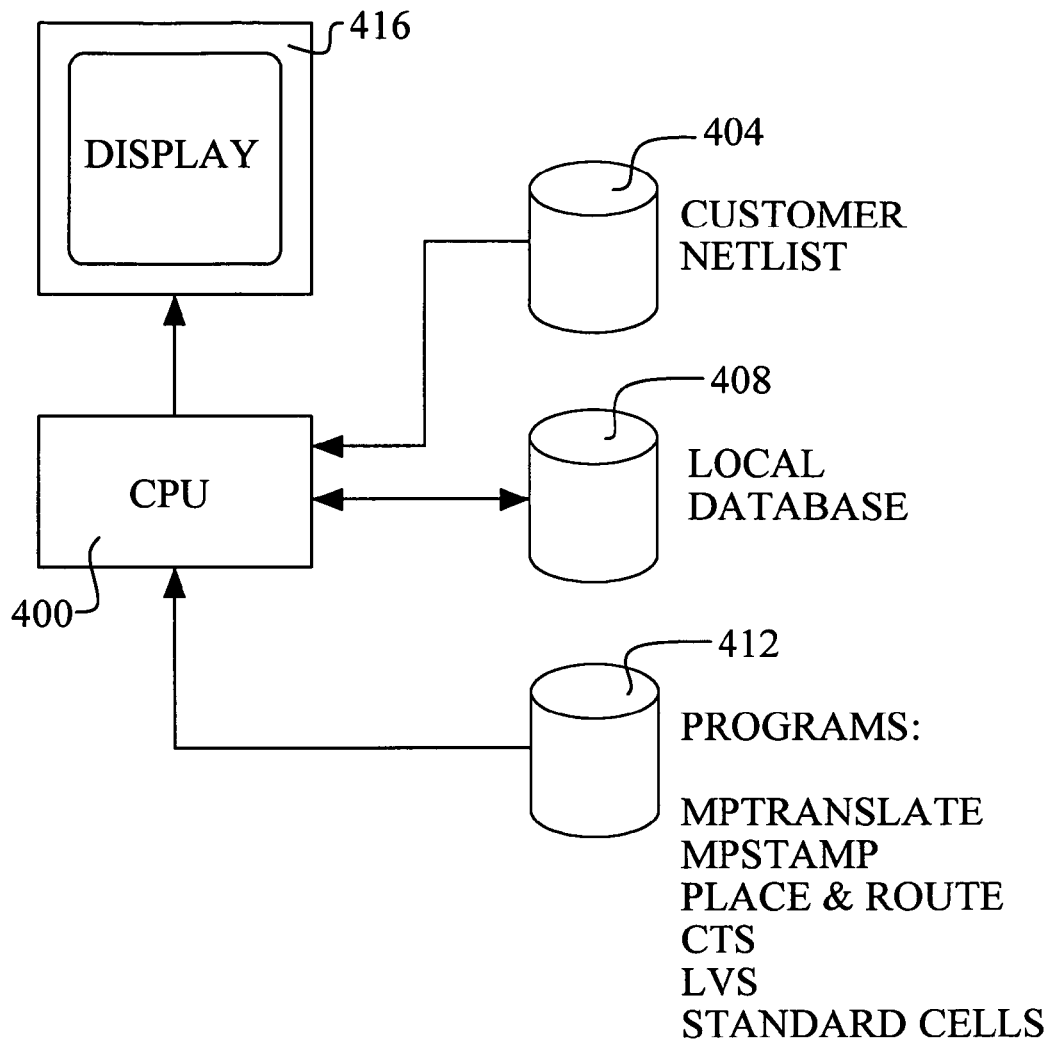
FIG. 7 illustrates the preferred embodiment of the apparatus of the preferred invention.

Referring now to FIG. 7, the preferred embodiment of the apparatus of the present invention is illustrated. In this apparatus, the novel method of the present invention may be applied to achieve the design and verification of a multi-power integrated circuit device. The apparatus first comprises a means of storing 404 a multi-power gate-level netlist that is provided. For example, the customer may release the multi-power gate-level netlist on a storage tape. This tape is then accessible via a storage tape reader and may then be copied onto a hard drive storage unit 404 for easier access. Second, a means of translating 400 the multi-power gate-level netlist to thereby create a non-multi-power gate-level netlist is provided. For example, a computer processing unit (CPU) 400 of a workstation may be used to perform the translating step. The workstation CPU 400 would access the necessary software programs, such as the MPTranslator program from a program storage device 412, such as a hard drive. The customer-released netlist would then be retrieved from the customer netlist storage drive 404. The workstation CPU 400 would then process the customer netlist using the MPTranslator instructions and generate the MPTranslated netlist with the multi-power net information removed. This MPTranslated netlist is then stored on the local database hard drive 408. In practice, all of the storage devices 404, 408, and 412, may comprise separate devices or a single device.

A means of placing and routing circuit cells 400 to create a physical view of the multi-power integrated circuit device is provided. The placing and routing means may comprise a workstation CPU 400. The workstation CPU first loads the placement and routing software from the program storage drive 412. The MPTranslated netlist is then loaded from the local database drive 408. The workstation CPU then performs the placement and routing operation and accesses standard cell component property data as needed from the program drive 412. The workstation CPU 400 saves the physical view data file thus created in the local database drive 408. Text labels for the multi-power net information are attached to the physical view.

A means of comparing 400 the physical view and the multi-power gate-level netlist is provided. For example, the workstation CPU may load an LVS program from the program drive 412. The customer-released netlist is then loaded from the customer netlist storage drive 404. The physical view file is loaded from the local drive 408. The workstation CPU 400 then performs the LVS analysis and stores the resulting output file on the local database drive 408. The correctness of the physical view is thereby verified. Finally, a means of displaying the physical view 416 is preferably provided by, for example, a CRT device 416.

The advantages of the present invention may now be summarized. First, the present invention provides a method and an apparatus to design and verify a multi-power integrated circuit device. The placement and routing and the layout versus schematic (LVS) verification of a multi-power integrated circuit device is improved. A single placement and routing and LVS pass may be used to complete the layout. A means to automatically translate the gate-level netlist used for placement and routing and for LVS is achieved to thereby eliminate errors. Finally, multi-power net information is automatically inserted into a gate-level netlist to thereby facilitate use of clock tree synthesis (CTS) placement and routing of the multi-power integrated circuit device.

As shown in the preferred embodiments, the novel method and apparatus of the present invention provide an effective means of designing and verifying a multi-power integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to design and verify a multi-power integrated circuit device comprising:
    providing a multi-power gate-level netlist comprising multi-power net information;
    translating said multi-power gate-level netlist to thereby create a non-multi-power gate-level netlist wherein said translating comprises removing said multi-power net information;
    placing and routing circuit cells to create a physical view of said multi-power integrated circuit device wherein said placing and routing uses said non-multi-power gate-level netlist and wherein text labels for said multi-power net information are attached to said physical view; and
    comparing said physical view and said multi-power gate level netlist to verify the correctness of said physical view and to complete said design and verification of said multi-power integrated circuit device.

2. The method according to claim 1 wherein said multi-power integrated circuit device comprises input/output (I/O) cells having multiple power supplies.

3. The method according to claim 2 wherein said multiple power supplies comprise a first supply of between about 2.5 Volts and a second supply of about 3.3 Volts.

4. The method according to claim 1 wherein said multi-power integrated circuit device comprises analog circuits and digital circuits.

5. The method according to claim 1 wherein said step of placing and routing further comprises clock tree synthesis (CTS) placement and routing.

6. The method according to claim 1 further comprising:
    clock tree synthesized (CTS) placing and routing of said circuit cells after said step of placing and routing circuit cells to create a physical view of said multi-power integrated circuit device wherein said CTS placing and routing updates said physical view and modifies said non-multi-power gate-level netlist to thereby create a CTS modified non-multi-power gate-level netlist; and
    inserting said multi-power net information into said CTS modified non-multi-power gate-level netlist to create an updated said multi-power gate-level netlist prior to said step of comparing said physical view and said multi-power gate-level netlist to verify the correctness of said physical view and to complete said design and verification of said multi-power integrated circuit device.

7. The method according to claim 6 further comprising:
    comparing said multi-power gate-level netlist and said updated multi-power gate-level netlist to thereby verify that no errors have been introduced after said step of inserting said includes multi-power net information into said CTS modified non-multi-power gate-level netlist.

8. The method according to claim 1 further comprising:
    simulating said multi-power gate-level netlist; and
    thereafter performing static timing analysis on said multi-power gate-level netlist prior to said step of providing said multi-power gate-level netlist.

9. A method to design and verify a multi-power integrated circuit device comprising:
    providing a multi-power gate-level netlist wherein said multi-power gate-level netlist includes multi-power net information;
    translating said multi-power gate-level netlist to thereby create a non-multi-power gate-level netlist wherein said translating comprises removing said multi-power net information;
    placing and routing circuit cells to create a physical view of said multi-power integrated circuit device wherein said placing and routing uses said non-multi-power gate-level netlist and wherein text labels for said multi-power net information are attached to said physical view;
    clock tree synthesized (CTS) placing and routing of said circuit cells after said step of placing and routing circuit cells to create a physical view of said multi-power integrated circuit device wherein said CTS placing and routing updates said physical view and modifies said non-multi-power gate-level netlist to thereby create a CTS modified non-multi-power gate-level netlist;
    inserting said multi-power net information into said CTS modified non-multi-power gate-level netlist to create an updated said multi-power gate-level netlist; and
    comparing said physical view and said updated multi-power gate-level netlist to verify the correctness of said physical view and to complete said design and verification of said multi-power integrated circuit device.

10. The method according to claim 9 wherein said multi-power integrated circuit device comprises input/output (I/O) cells having multiple power supplies.

11. The method according to claim 10 wherein said multiple power supplies comprise a first supply of between about 2.5 Volts and a second supply of about 3.3 Volts.

12. The method according to claim 9 wherein said multi-power integrated circuit device comprises analog circuits and digital circuits.

13. The method according to claim 9 further comprising:
comparing said multi-power gate-level netlist and said updated multi-power gate-level netlist to thereby verify that no errors have been introduced after said step of inserting said includes multi-power net information into said CTS modified non-multi-power gate-level netlist.

14. The method according to claim 9 further comprising:
simulating said multi-power gate-level netlist; and
thereafter performing static timing analysis on said multi-power gate-level netlist prior to said step of providing said multi-power gate-level netlist.

15. An apparatus to design and verify a multi-power integrated circuit device comprising:
a means of storing a multi-power gate-level netlist that is provided;
a means of translating said multi-power gate-level netlist to thereby create a non-multi-power gate-level netlist wherein said means of translating comprises removal of said multi-power net information;
a means of placing and routing circuit cells to create a physical view of said multi-power integrated circuit device wherein said means of placing and routing uses said non-multi-power gate-level netlist and wherein text labels for said multi-power net information are attached to said physical view; and
a means of comparing said physical view and said multi-power gate-level netlist to thereby verify the correctness of said physical view and to complete said design and verification of said multi-power integrated circuit device.

16. The apparatus according to claim 15 wherein said means of translating comprises a software program running on a computer processing unit.

17. The apparatus according to claim 15 wherein said means of comparing comprises a logic versus schematic (LVS) software program running on a computer processing unit.

18. The apparatus according to claim 15 further comprising:
a means of performing a clock tree synthesized (CTS) placing and routing of said circuit cells to create a physical view of said multi-power integrated circuit device wherein said means of performing CTS placing and routing updates said physical view and modifies said non-multi-power gate-level netlist to thereby create a CTS modified non-multi-power gate-level netlist; and
a means of inserting said multi-power net information into said CTS modified non-multi-power gate-level netlist to create an updated said multi-power gate-level netlist for use by said means of comparing said physical view and said multi-power gate-level netlist to verify the correctness of said physical view and to complete said design and verification of said multi-power integrated circuit device.

19. The apparatus according to claim 18 further comprising a means of comparing said multi-power gate-level netlist and said updated multi-power gate-level netlist to thereby verify that no errors have been introduced.

20. The apparatus according to claim 15 further comprising a means of displaying said physical view of said multi-power integrated circuit device.

* * * * *